(12) United States Patent
Punzalan, Jr. et al.

(10) Patent No.: US 7,235,870 B2
(45) Date of Patent: Jun. 26, 2007

(54) MICROELECTRONIC MULTI-CHIP MODULE

(76) Inventors: Nelson V. Punzalan, Jr., 23 Topacio Street, Mageaseville Subdivision, San Pablo City, Laguna 4000 (PH); Marcelino Ian W. Estinozo, II, 241 5th Street, Bitoon Circle, Commonwealth Avenue, Qeuzon City, Metro Manila 1121 (PH)

( * ) Notice: Subject to any disclaimer, the term of this patent is extended or adjusted under 35 U.S.C. 154(b) by 134 days.

(21) Appl. No.: 11/027,091

(22) Filed: Dec. 30, 2004

(65) Prior Publication Data
US 2006/0145327 A1   Jul. 6, 2006

(51) Int. Cl.
*H01L 23/02* (2006.01)
(52) U.S. Cl. .............. 257/685; 257/686; 257/777; 257/E25.021; 257/E25.027; 257/E23.085; 438/109; 438/FOR. 368
(58) Field of Classification Search .............. None
See application file for complete search history.

(56) References Cited

U.S. PATENT DOCUMENTS

| | | | |
|---|---|---|---|
| 6,462,421 B1 * | 10/2002 | Hsu et al. ............... 257/777 |
| 6,495,910 B1 * | 12/2002 | Wu ............... 257/686 |
| 6,583,503 B2 * | 6/2003 | Akram et al. ............ 257/686 |
| 6,633,078 B2 * | 10/2003 | Hamaguchi et al. ....... 257/686 |
| 6,639,309 B2 * | 10/2003 | Wallace ............... 257/678 |
| 6,734,539 B2 * | 5/2004 | Degani et al. ........... 257/686 |
| 6,781,241 B2 * | 8/2004 | Nishimura et al. ....... 257/777 |
| 6,838,761 B2 * | 1/2005 | Karnezos .............. 257/685 |
| 6,927,485 B2 | 8/2005 | Lai et al. |
| 2002/0030261 A1 | 3/2002 | Rolda et al. |
| 2003/0132519 A1 * | 7/2003 | Huang ............... 257/738 |

* cited by examiner

*Primary Examiner*—Jasmine Clark
(74) *Attorney, Agent, or Firm*—Laleh Jalali

(57) ABSTRACT

A method of fabricating a microelectronic multi-chip module comprises: providing a cavity down ball grid array having a die and solder balls on a die side thereof; providing a package including at least one die thereon on a die side thereof; stacking the package onto the backside of the ball grid array opposite from the die side of the ball grid array. The backsides of the ball grid array and of the package may include land pads for providing interconnection between the ball grid array and the package during stacking.

14 Claims, 5 Drawing Sheets

MICROELECTRONIC MULTI-CHIP MODULE

FIELD

Embodiments of the present invention relate to the field of integrated circuit (IC) device packaging technology, and, in particular, to techniques for packaging multi-chip modules.

BACKGROUND

The prior art provides a number of ways to stack multi-chip modules ("MCM's"). Two existing packaging technologies in particular address problems typically associated with the stacking of such modules.

The Ultra Thin Stacked Chip Scale Package (UT-SCSP) technology envisions using thinner dice, for example, dice having a height ("z height") of up to about 3 mils (instead of the usual 4 or 5 mils for a conventional Stack Chip Scale Package), and then stacking about two to about five of such dice. An example of a UT-SCSP is shown in FIG. 1. As seen in FIG. 1, a UT-SCSP module 100 includes a substrate 110 including conductive traces 120 connected to solder balls 130, wirebonds 140 connecting conductive traces 120 to respective ones of the dice 150, the dice being mounted to each other with conventional die attach 160. Dice 150 are embedded in a mold compound 170. UT-SCSP technology allows an increase in package capability and functionality while maintaining specific z-height requirements and the same footprint. For example, UT-SCSP technology offers the possibility of stacking two to five memory die with an optional logic die in a single module. The total module thickness varies from between about 1.0 to about 1.4 mm. However, UT-SCSP technology does not allow a stacking of square-shaped dice without the use of a spacer in between the dice, since the wirebonds of a bottom die would otherwise touch the top die. In addition, and as suggested in FIG. 1, UT-SCSP technology does not allow an optimum package test yield when a defective die is part of the package, to the extent that UT-SCSP technology provides an already stacked module before testing can be effected.

An alternative technology, termed the Folded Stacked Chip Scale Package technology (FS-CSP technology), envisions folding a top package over a bottom package using a folded flop, that is, a flexible substrate with copper traces that is folded for the purpose of interconnection. The top package typically has a land pad which serves as the connection between the top package and the bottom package. An example of an FS-CSP module is shown in FIG. 2. As seen in FIG. 2, a FS-CSP module 200 includes a top package 210 and a bottom package 220. Each of the packages includes a substrate 230 having conductive traces (not shown) connected to solder balls 240, wirebonds 250 connecting conductive traces in the substrate to respective ones of the dice 260, the dice being mounted to each other with conventional die attach (not shown). Dice 260 are embedded in a mold compound 280. FS-CSP technology allows higher test yields with when compared with UT-SCSP technology, to the extent that the bottom and top packages, such as bottom package 220 and top package 210, are assembled separately, thus allowing the packages to be tested prior to stacking. However, FS-CSP technology results in the creation of a module exhibiting bending stresses that tend to crack associated conductive traces, such as conductive traces (not shown) in flexible substrate 290 of module 200, disadvantageously creating the risk of open traces. Another disadvantage of an FS-CSP module is the existence of extended copper traces from the top package to the bottom package, which traces, by virtue of their extended length, tend to cause increase resistances and hence large voltage losses.

One way to package electronic devices together is through the use of a ball grid array (BGA). Among the conventional types of electronic packages, ball grid array (BGA) is most common. A back of a die is attached to the bonding pad on a substrate using an adhesive tape or other nonconductive adhesive materials. The bonding pads on the die and the contact points on the substrate are electrically connected using conductive wires. An encapsulation encloses the die, the conductive wires, and the contacts. In addition, a plurality of solder balls is planted onto the ball pads on the substrate so that the ball grid array may transmit electrical signals to the external circuit through the solder balls. Since the circuit layout on the BGA package is arranged in the form of an array, the package can accommodate a large number of external contacts. FIG. 3 is a schematic cross-sectional view of a conventional cavity down ball grid array package. As shown in FIG. 3, the cavity down ball grid array package 300 includes a substrate 310, a die 320, a plurality of conductive traces 330, wirebonds 335, an encapsulation mold 340 and a plurality of solder balls 350. The solder balls 350 are attached to contacts on the substrate 310. Through the solder balls 350, the substrate 310 can connect electrically with an external circuit (not shown). In a cavity down BGA, as in BGA 300, the die and solder balls are attached on one surface of the substrate, the other surface being available for attachment to a conductive pad, such as a copper pad, or directly to a heat sink for improved thermal and electrical performance. The provision of the die and solder balls on a single surface of the substrate brings about a lower height of the package.

None of the available packaging techniques that allow maintaining height requirements of a package without losing package functionality and capacity.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION

A method of fabricating a microelectronic multi-chip module, a multi-chip module fabricated according to the method, and a system incorporating the multi-chip module are disclosed herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
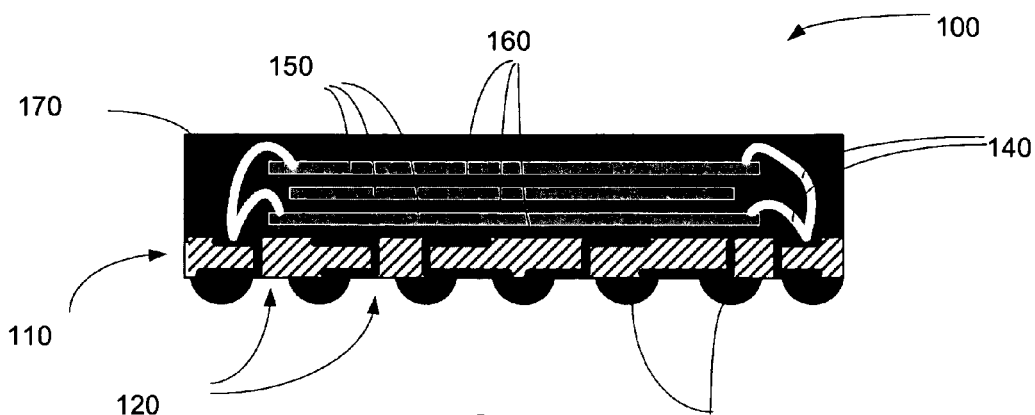
FIG. 1 is a cross sectional view of an Ultra Thin Stacked Chip Scale Package according to the prior art.
Figure 2:
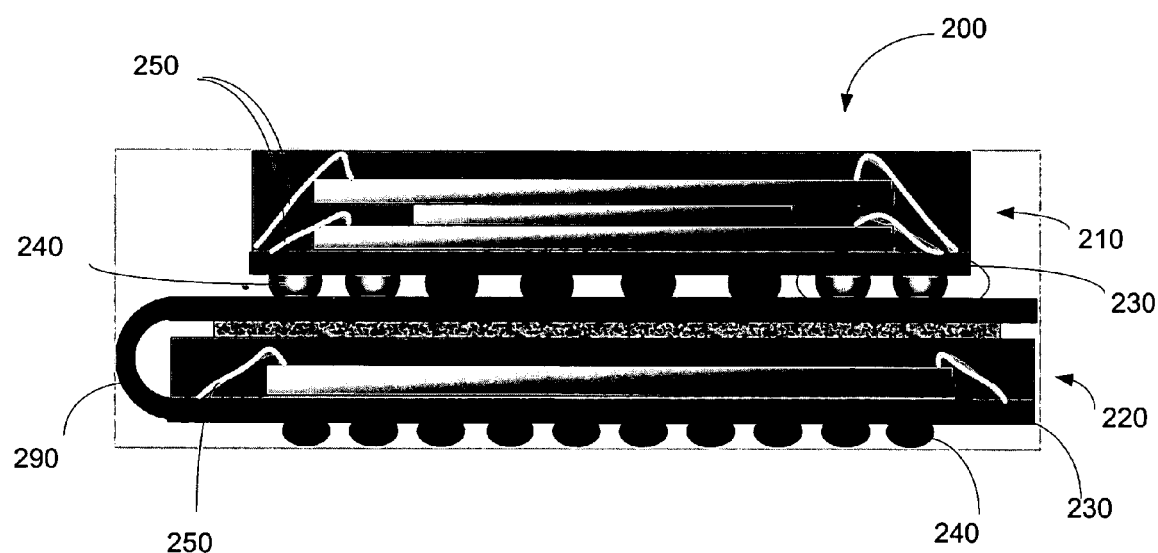
FIG. 2 is a cross sectional view of a Folded Stacked Chip Scale Package according to the prior art.
Figure 3:
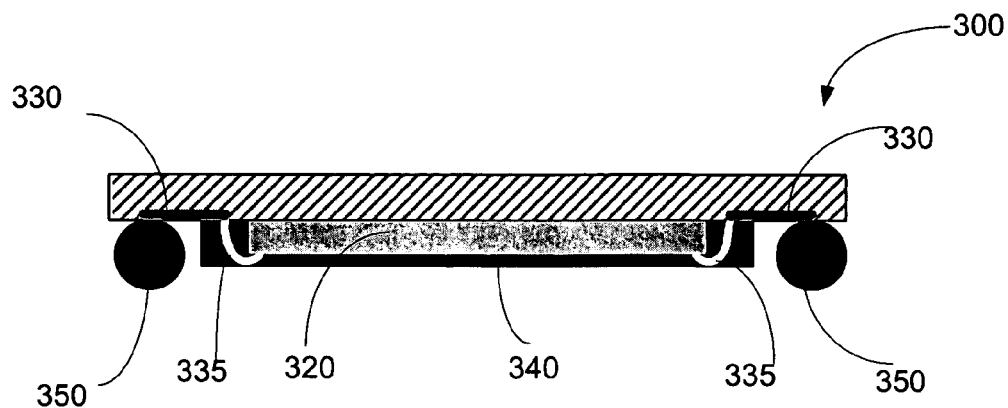
FIG. 3 is a cross sectional view of a cavity down ball grid array according to the prior art.
Figure 4:
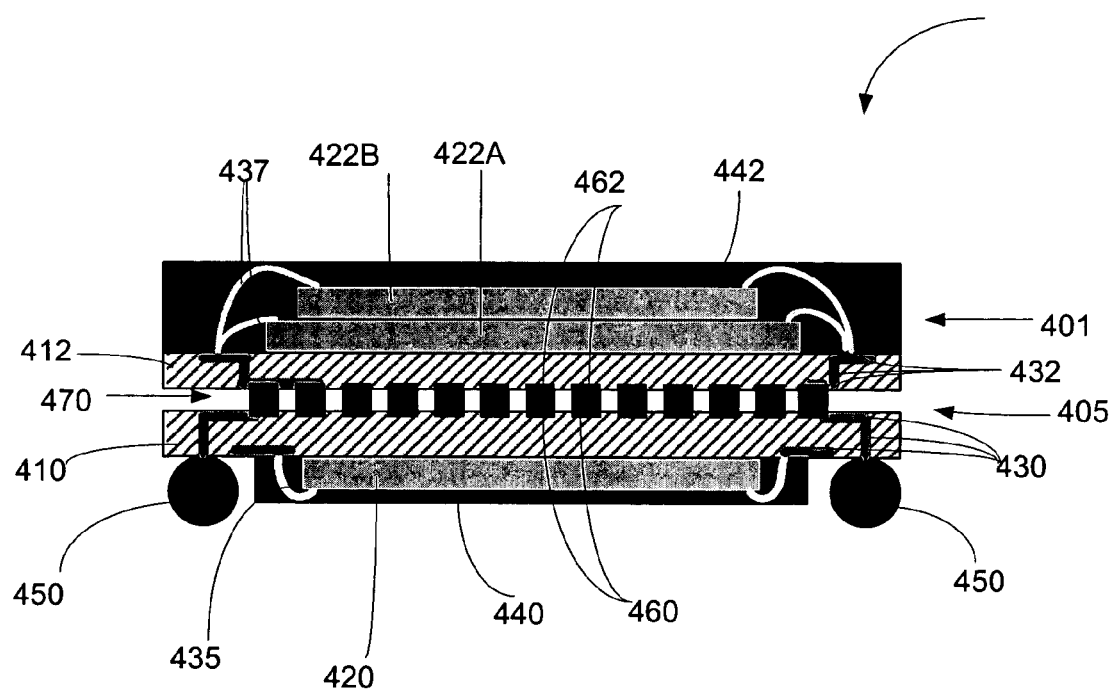
FIG. 4 is a cross sectional view of a multi-chip module according to an embodiment of the present invention.

Referring now to FIG. 4, a multi-chip module 400 includes a top package 401 and a bottom package 405. Bottom package 405 is a cavity down BGA package which includes a substrate 410, a die 420, a plurality of conductive traces 430, wire bonds 435 connecting traces 430 to respective ones of the dice, an encapsulation mold 440 and a plurality of solder balls 450. The solder balls 450 are attached to contacts on substrate 410. Through the solder balls 450, the substrate 410 can connect electrically with an external circuit, for example through a board 460. Bottom package 405 provides the die and solder balls on a single side of the package, in this way allowing a lowered height of the package when compared with a package where the die and solder balls would be on different sides of the substrate. The open space between substrate 410 and solder balls 450 serves as space for die 420, a total mold cap height of bottom package 405 being limited by a total reflowed height of solder balls 450. Bottom package 405 further includes land pads 460 that serve as interconnects with top package 401.

As further seen in FIG. 4, top package 401 includes a substrate 412, a plurality of dice 422, a plurality of conductive traces 432, wire bonds 437 connecting traces 432 to respective ones of the dice, and an encapsulation mold 442. While top package 401 shown in the embodiment of FIG. 4 contains two dice, top package 401 according to embodiments of the present invention may contain any device built from single to multiple die stacks. Dice 420 and 422 may include, by way of example, microprocessors, chipsets, memory devices, ASICs, and the like. Top package 401 may be made using a process known in the art as the "Molded Matrix Array Package" (MMAP) assembly process. MMAP technology provides a method of simultaneously packaging a plurality of microelectronic dice, such as dice 422, in a minimal number of process steps. Using chip-scale flip-chip package technology as an example, MMAP allows multiple dice of the same configuration to be interconnected onto a single carrier substrate panel in an ordered array, underfilled, encapsulated with mold compound, and singulated into individual microelectronic devices by cutting the carrier substrate panel in the area between each microelectronic die. In addition, top package 401 may include, by way of example, an UTSCSP or a VFBGA (or Very Fine Ball Grid Array). Top package 401 additionally includes land pads 462 that serve as interconnects with the bottom package 405 through a layer 470 of interconnect material, such as, for example, solder paste. Solder paste has an advantage of maintaining a thin clearance between the top and bottom packages as compared with solder balls.

Referring next to FIGS. 5A–5E, and 6A–6D, stages in the fabrication of bottom package 405 and top package 401 are depicted, respectively.

Figure 5A:
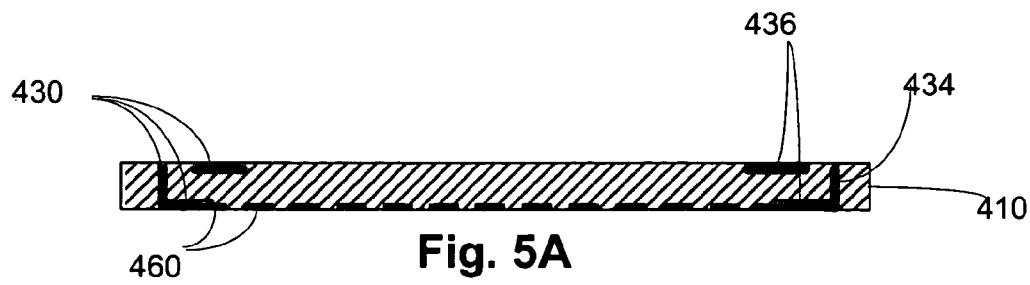
FIGS. 5A–5E are cross sectional views showing stages in the fabrication of the bottom package in the module of FIG. 4.
Figure 6A:
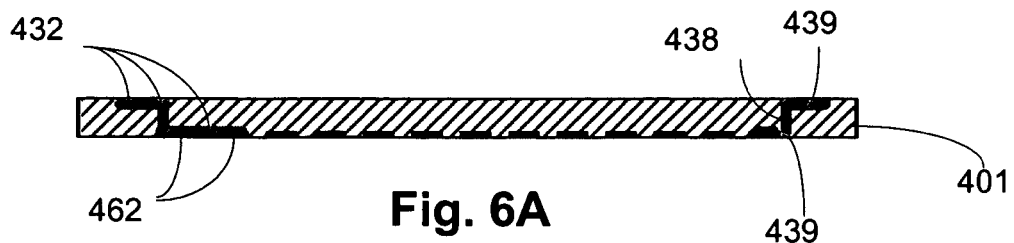
FIGS. 6A–6D are cross sectional views showing stages in the fabrication of the top package in the module of FIG. 4.

As seen in FIGS. 5A and 6A, an embodiment of the present invention may include providing conductive elements on a substrate. According to one embodiment, such as the embodiment of FIG. 5A, the conductive elements may include conductive traces 430 and land pads 460 provided on a substrate 410, such as a silicon substrate. According to one embodiment, such as the embodiment of FIG. 6A, the conductive elements may include conductive traces 432 and land pads 480 provided on a substrate 412, such as a silicon substrate. Provision of traces 430 and pads 460 (FIG. 5A), and of traces 432 and land pads 480 (FIG. 6A), may be made according to conventional methods. For example, provision of the conductive traces 430 and/or 432 may include providing via openings in the substrate and filling the via openings with a conductive material, such as, for example copper or tungsten, to provide a via, such as vias 434 (FIG. 5A) or 438 (FIG. 6A). Provision of the conductive traces may further include providing a metal interconnect pattern 436 (FIG. 5A) or 439 (FIG. 6A) on the top and bottom surfaces of substrates 410 and 412, respectively. For example, the substrate may be laminated with a conductive material such as copper to provide metallization layers on the top and bottom surfaces of the substrate. Thereafter, a mask may be used to pattern conductors on the metallization layers to provide traces such as traces 430 and lands 460 (FIG. 5A), or such as traces 432 and lands 480 (FIG. 6A), as would be recognized by one skilled in the art. With respect to lands 460 and 480, according to embodiments of the present invention, they are distributed on respective ones of the corresponding surfaces of substrates 410 and 412 such that, when the corresponding surfaces are placed in face to face relationship with one another, lands 460 can be located with respect to lands 480 to be in registration with lands 480 as best seen in FIG. 4.

Figure 5B:
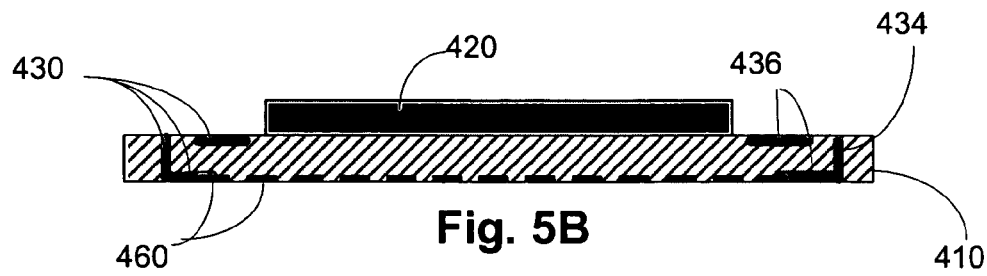
Figure 6B:
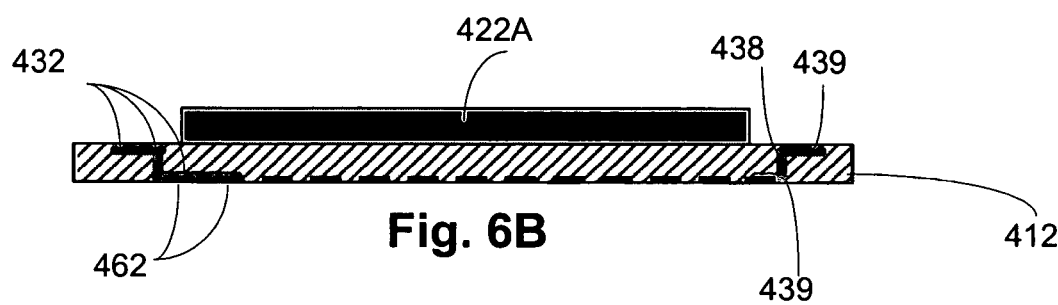
Figure 6B:
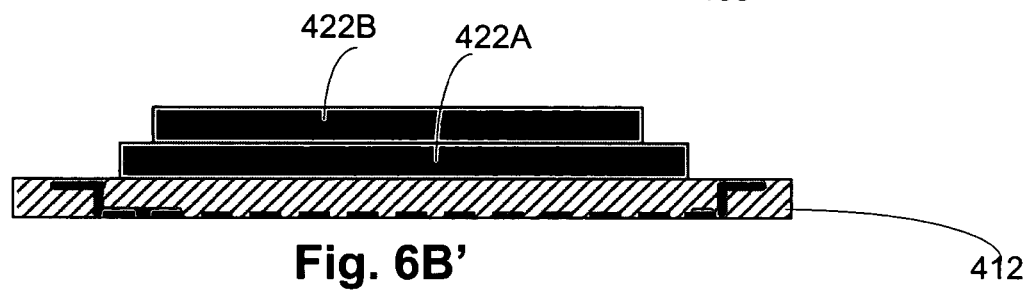

Referring next to FIGS. 5B and 6B, an embodiment of the present invention may include attaching a die to a surface of the substrate of each of FIGS. 5A and 6A. Attachment of the die may be effected according to any one of well known methods. By way of example, a die attach material (not shown), such as, for example, may be used to attach die 420 to substrate 410 (FIG. 5B), or to attach die 422A to substrate 412 (FIG. 6B). The die attach material may be an electrically conductive or electrically insulative material, a thermoset adhesive, or a combination thereof. Optionally, a die attach pad, such as, for example, a solder pad (now shown), may be used between the die attach material and the substrate in order to enhance an adhesion of the die to the substrate. By way of example, the die attach material may include silver-filled epoxy or bismalemide. In the alternative, the die may be directly soldered onto the substrate.

Referring next to FIG. 6B', an embodiment of the present invention may include stacking at least one die onto the die of FIG. 6B. Stacking according to FIG. 6B' may be effected according to any one of well known methods. For example, a die attach similar to the die attach described in relation to FIGS. 5B and 6B may be used to attach the at least one die, such as die 422B, to die 422A of FIG. 6B to achieve the configuration of FIG. 6B'.

Figure 5C:
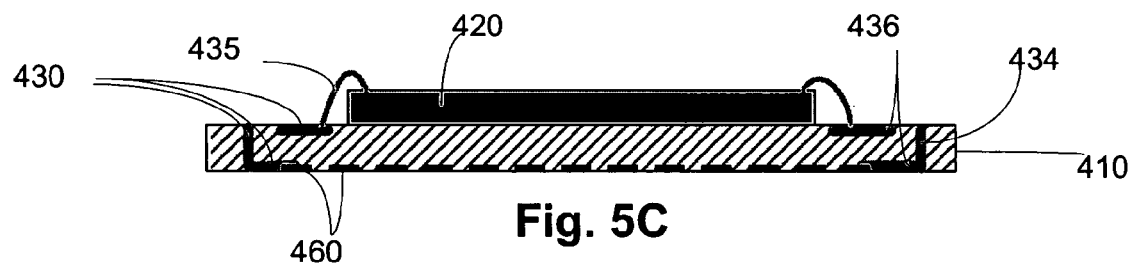
Figure 6C:
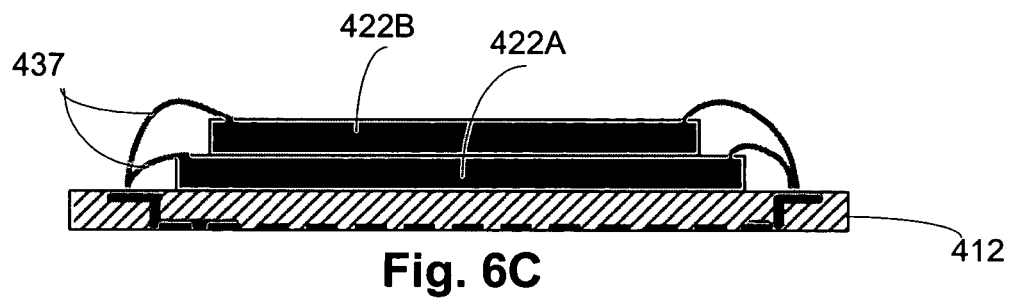

As next seen in FIG. 5C, an embodiment of the present invention may include providing wire bonds between the die and the substrate of FIGS. 5B, such as wire bonds 435. As seen in FIG. 6C, an embodiment of the present invention may include providing wire bonds between each of the dies of FIG. 6B' and the substrate of FIG. 6B', such as wire bonds 437. Wire bonding may be effected according to any one of well known wire bonding methods. According to one embodiment, the wirebonds may include gold.

Figure 5D:
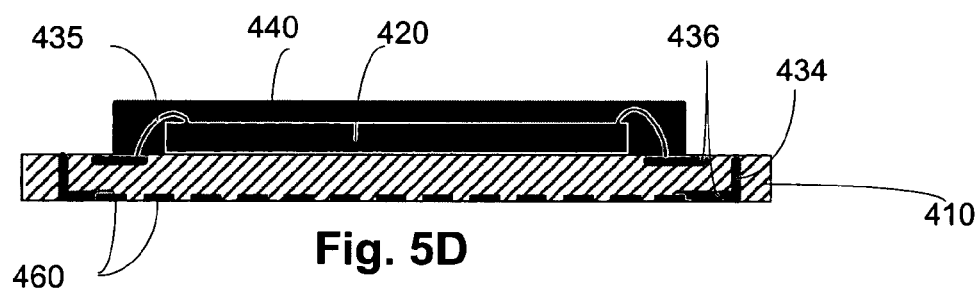
Figure 6D:
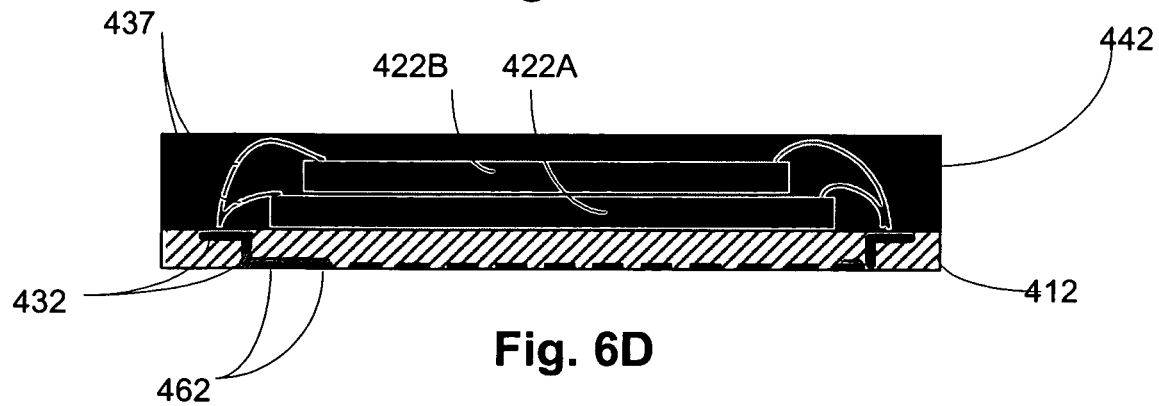

As next seen in FIGS. 5D and 6D, an embodiment of the present invention may include encapsulating the die(s) and wirebonds of FIGS. 5C and 6C in a mold compound or encapsulation mold. As seen in FIG. 5D, the die 420 and wirebonds 435 are encapsulated in mold 440. As seen in FIG. 6D, the dies 422A and 422B, and, in addition, wirebonds 437, are encapsulated in mold 442. Encapsulation of the die and wirebonds may be effected according to any one of well known methods. The mold compound provides protection from chemical contamination or physical damage in subsequent manufacturing processes and during use. The mold compound may comprise, by way of example, multifunctional epoxy, novolac, biphenyl resin, or a combination thereof. FIG. 6D shows top package 401 as having been formed.

Figure 5E:
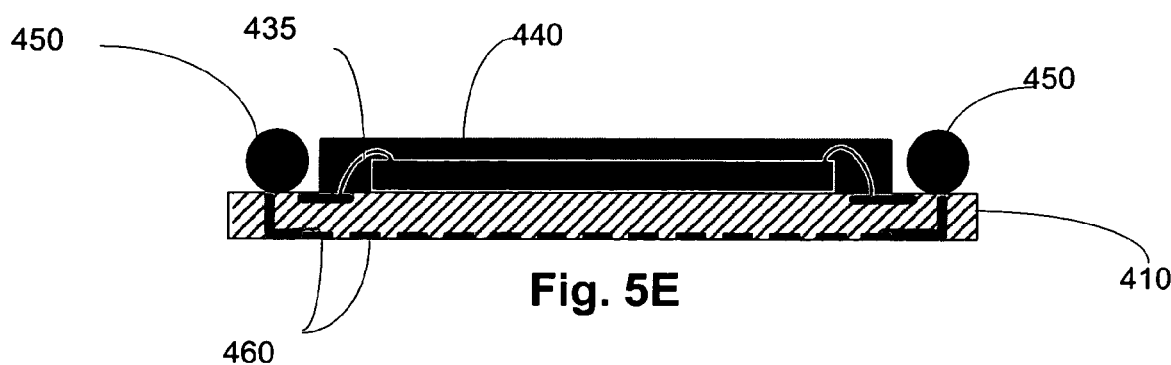

Referring now to FIG. 5E, an embodiment of the present invention may include providing solder balls on substrate the substrate of FIG. 5D on the same side as the die. Provision of solder balls may be effected according to any one of well known methods. According to one embodiment, solder balls are mounted onto substrate 410, and then reflowed in order to effect a connection of the same to the substrate. FIG. 5E shows bottom package as having been formed.

Figure 7:
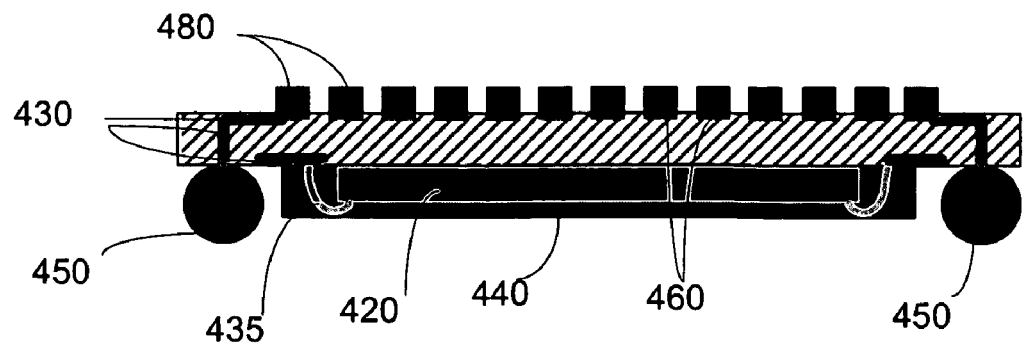
FIG. 7 is a cross sectional view of a conductive material having been provided onto the bottom package of the module of FIG. 4.

Referring back to FIG. 4, an embodiment of the present invention comprises stacking the top package of FIG. 6D onto the bottom package shown in FIG. 5E. Stacking may, according to one embodiment, include applying a conductive material onto at least some of the conductive elements of the bottom package 405, and then stacking top package 401 onto bottom package 405 such that the conductive material provides an electrical and mechanical connection between the top package 401 and bottom package 405. According to one embodiment, as shown for example in FIG. 7, applying comprises applying solder paste 480 to lands 460 of substrate 410 as shown. In one embodiment, bottom package 405, as shown in FIG. 5E, may first be flipped over, and then solder paste 480 applied as shown in FIG. 7. Thereafter, the top package 401 may be connected onto bottom package 401 yielding the multi-chip module 400 of FIG. 4.

Advantageously, embodiments of the present invention provide a simple method of providing a multi-chip module which represents an increase in unit capacity within the same footprint. The above may be achieved by stacking a package onto the backside of a cavity down BGA (that is, the side of the cavity down BGA opposite the die side). According to one embodiment, stacking may advantageously be achieved by providing land pads on the backside of the cavity down BGA to allow connection between the package and the cavity down BGA. Advantageously, embodiments of the present invention allow package design flexibility and functionality within the same footprint. Additionally, embodiments of the present invention allow the integration of multiple die types, such as, for example, a logic die and memory, or SRAM/DRAM and memory, into a package level, while maintaining predetermined z-height requirements. In addition, advantageously, embodiments of the present invention minimize package yield losses by allowing the testing of defecting dies prior to completion of stacking (contrary, for example, to the UTSCSP of the prior art described above) further minimizing voltage drops by reducing connection paths between the top and bottom packages (contrary, for example, to the FSCSP of the prior art also described above). Moreover, embodiments of the present invention allow customization of multi-chip modules in accordance with specific requirements by allowing the storage of individual packages already tested prior to assembly, the packages then being adapted to be stacked at the time the specific requirements are determined.

Figure 8:
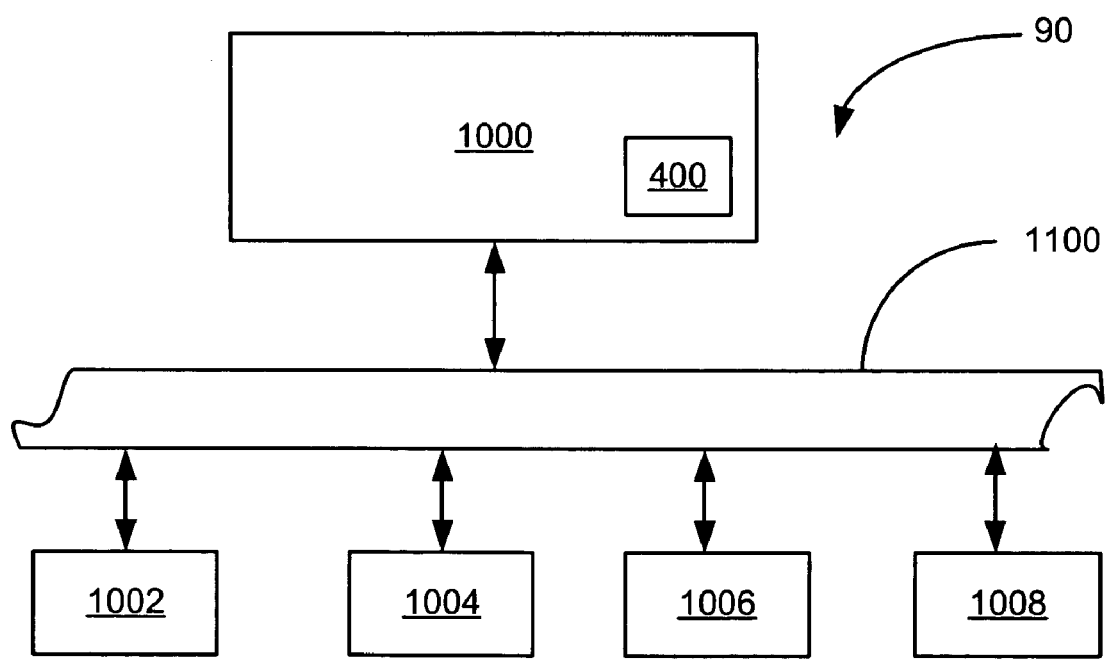
FIG. 8 is a schematic view of a system incorporating the multi-chip module of FIG. 4.

Referring to FIG. 8, there is illustrated one of many possible systems 90 in which embodiments of the present invention may be used. In one embodiment, the electronic assembly 1000 may include a multi-chip module, such as module 400 of FIG. 4. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 8, the system 90 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of fabricating a microelectronic multi-chip module comprising:
   providing a bottom package including a cavity down ball grid array having:
   a bottom package substrate;

a die and solder balls on a die side of the bottom package substrate; and conductive elements on a backside of the bottom package substrate opposite from the die side of the bottom package substrate;

providing a top package including:

a top package substrate;

a die on a die side of the top package substrate;

conductive elements on a backside of the top package substrate opposite from the die side of the top package substrate; and stacking the top package onto a backside of the bottom package such that conductive elements of respective ones of the bottom package and the top package are placed in registration with one another to provide an electrical connection between the bottom package and the top package.

2. The method of claim 1, wherein the conductive elements of at least one of the bottom package and the top package comprise a plurality of land pads.

3. The method of claim 1, wherein stacking comprises providing a conductive material between the conductive elements of the bottom package and the conductive elements of the top package for providing an electrical and mechanical connection between the bottom package and the top package.

4. The method of claim 3, wherein the conductive material comprises solder paste.

5. The method of claim 1, wherein the die on a die side of the top package comprises a plurality of dies.

6. The method of claim 1, wherein providing a bottom package comprises:

providing wire bonds between the die on the die side of the bottom package and the bottom package substrate;

encapsulating the die on the die side of the bottom package and the wire bonds.

7. The method of claim 6, wherein providing the top package comprises:

providing wire bonds between the die on the die side of the top package and the top package substrate; and encapsulating the die on the die side of the top package and the wire bonds.

8. The method of claim 3, wherein the conductive material comprises solder balls.

9. A microelectronic multi-chip module comprising:

a bottom package comprising a cavity down ball grid array including:

a bottom package substrate;

a die and solder balls on a die side of the bottom package substrate; and conductive elements on a backside of the bottom package substrate opposite from the die side of the bottom package substrate;

a top package including:

a top package substrate;

a die on a die side of the top package substrate; and conductive elements on a backside of the top package substrate opposite from the die side of the top package substrate, the top package being stacked onto the backside of the bottom package such that the conductive elements of respective ones of the bottom package and the top package are placed in registration with one another to provide an electrical connection between the bottom package and the top package.

10. The module of claim 9, wherein the conductive elements of at least one of the bottom package and the top package comprise land pads.

11. The module of claim 10, further comprising solder mechanically and electrically connecting conductive elements of respective ones of the bottom package and the top package to one another.

12. A system comprising:

a microelectronic multi-chip module including:

a bottom package comprising a cavity down ball grid array including;

a bottom package substrate;

a die and solder balls on a die side of the bottom package substrate: and conductive elements on a backside of the bottom package substrate opposite from the die side of the bottom package substrate;

a top package including:

a top package substrate;

a die on a die side of the top package substrate;

conductive elements on a backside of the top package substrate opposite from a die side of the top package substrate, the top package being stacked onto the backside of the bottom package such that the conductive elements of respective ones of the bottom package and the top package are placed in registration with one another to provide an electrical connection between the bottom package and the top package; and a graphics processor coupled to the module.

13. The system of claim 12, wherein the conductive elements of at least one of the bottom package and the top package comprise land pads.

14. The system of claim 13, further comprising solder mechanically and electrically connecting conductive elements of respective ones of the bottom package and the top package to one another.

* * * * *